US007855393B2

(12) United States Patent
Rösler et al.

(10) Patent No.: US 7,855,393 B2

(45) Date of Patent: Dec. 21, 2010

(54) LIGHT EMITTING DEVICE WITH A NON-ACTIVATED LUMINESCENT MATERIAL

(75) Inventors: Sven Rösler, Eisenach (DE); Sylke Rösler, Eisenach (DE); Wolfgang Kempfert, Bad Liebenstein (DE); Detlef Starick, Greifswald (DE); Peter Pachler, Graz-St. Peter (AT); Stefan Tasch, Jennersdorf (AT); Paul Hartmann, Weiz (AT); Hans Hoschopf, Jennersdorf (AT)

(73) Assignee: Tridonic Optoelectronics GmbH (AT)

( * ) Notice: Subject to any disclaimer, the term of this patent is extended or adjusted under 35 U.S.C. 154(b) by 0 days.

(21) Appl. No.: 12/278,257

(22) PCT Filed: Jan. 8, 2007

(86) PCT No.: PCT/EP2007/000098

§ 371 (c)(1), (2), (4) Date: Jun. 12, 2009

(87) PCT Pub. No.: WO2007/087954

PCT Pub. Date: Aug. 9, 2007

(65) Prior Publication Data

US 2009/0294788 A1 Dec. 3, 2009

(30) Foreign Application Priority Data

Feb. 3, 2006 (DE) ........................ 10 2006 005 042

(51) Int. Cl.
*H01L 33/00* (2010.01)

(52) U.S. Cl. ............. 257/98; 257/E35.001; 257/E25.02

(58) Field of Classification Search .................. 257/98, 257/100, E35.001, 25.02; 362/84, 260, 235, 362/555; 349/25, 77, 86; 345/107
See application file for complete search history.

(56) References Cited

U.S. PATENT DOCUMENTS 6,747,406 B1 * 6/2004 Bortscheller et al. ........ 313/512
2003/0168669 A1 * 9/2003 Chua .......................... 257/98
2003/0218420 A1 11/2003 Zovko
2004/0004433 A1 1/2004 Lamnsky et al.
2004/0046497 A1 3/2004 Schaepkens et al.
2004/0164311 A1 * 8/2004 Uemura ....................... 257/99
2005/0082574 A1 * 4/2005 Tasch et al. ................. 257/202
2005/0162069 A1 * 7/2005 Ota et al. .................... 313/501
2006/0273340 A1 * 12/2006 Lv ............................ 257/100
2007/0120135 A1 * 5/2007 Soules et al. .................. 257/98

OTHER PUBLICATIONS

International Search Report; PCT/EP2007/000098; Apr. 23, 2007.

* cited by examiner

*Primary Examiner*—Thomas L Dickey
*Assistant Examiner*—Nikolay Yushin
(74) *Attorney, Agent, or Firm*—Cantor Colburn LLP

(57) ABSTRACT

The invention relates to a light emitting device having a radiation emitting element, for example a light emitting diode, and a luminescent material which is able to absorb a part of the radiation sent out by the radiation emitting element and to send out light with a wavelength which is different from the wavelength of the absorbed radiation. The device further has diffusing particles which are able to scatter a part of the radiation sent out by the radiation emitting element, and/or to scatter a part of the light sent out by the luminescent material. The diffusing particles are of non-activated luminescent material, through which production is simplified.

12 Claims, 7 Drawing Sheets

Δ
θ
1
4
3
5
6
2

LIGHT EMITTING DEVICE WITH A NON-ACTIVATED LUMINESCENT MATERIAL

TECHNICAL FIELD OF THE INVENTION

The invention relates to a light emitting device with a radiation emitting element which includes a semiconductor. The device has a luminescent material which is able to absorb a part of the radiation sent out by the radiation emitting element and send out light with a wavelength which is different from the wavelength of the absorbed radiation. In addition, the invention relates to the use of a non-activated luminescent material in a light emitting device.

BRIEF DISCUSSION OF RELATED ART

Such devices are known from the state of the art, whereby the radiation emitting element diode is typically in the form of a light emitting diode (short: light diode, LED). As a rule, the radiation sent out by an LED lies in the visible and/or ultraviolet (UV) region. The spectral composition of this radiation depends particularly on the semiconductor material employed. There are for example LEDs which emit blue light.

Furthermore it is known to arrange in the direction of emission of the LED (in the following described in simplified terms as "over" the LED) a luminescent material in the form of particles distributed over space which absorbs in part the radiation sent out by the LED and sends out radiation in another wavelength range, as a rule at longer wavelengths. For example UV radiation which is sent out by the LED can be "transformed" into ("visible") light by luminescent material particles. As a luminescent material there is normally used for this purpose particles of fluorescent material. Corresponding arrangements are for example known from the documents U.S. Pat. No. 6,809,347 B2, US 2005/0077532 A1 and JP 10097201 A.

"Fluorescence" strictly speaking designates an emission process from an S1 state into an S0 state, which takes place in the 10 ns to 100 ns range. "Phosphorescence", in contrast, an emission process from a T1 into an S0 state, which manifests itself in the μs to ms range. The collective term for the two processes is "luminescence". In the following (for simplicity) under the term "fluorescent", fluorescence and phosphorescence processes are to be understood.

For example there is known an equipment with an LED which sends out blue light and has luminescent material in the form of fluorescent particles which partly absorb the blue light sent out by the LED and send out yellow light, thus so to speak transform blue light into yellow or "yellowish" light. In this context, there is also known luminescent material which changes blue light into green or "greenish" or red or "reddish" light. A combination of corresponding luminescent materials is also known.

If one looks at such a light emitting device, then there generally meets the eye of the observer light radiated from the LED which leaves the device without wavelength transformation by the fluorescent particles, that is blue light, and for example also yellow light which is sent out by the fluorescent particles. In this way there arises a more or less distinct white light.

Thereby the phenomenon appears, that the colour impression of the light generally depends from which direction the device is looked at. In particular there is manifest a dependence on the angle Θ between the surface normals of the (main) emission surface, that is the surface of the active layer, i.e. the substrate surface of the LED (briefly designated "surface normals of the LED" in the following), and the direction from the device to the eye of the observer. The reason for this lies in that the light which exits to the outside directly from the LED without wavelength transformation at the luminescent material is emitted preferentially in a certain solid angle, and to be more precise in a region around the surface normals of the LED, whereas the light which is sent out by the luminescent material particles is emitted more evenly to all directions, thus quasi "isotropically". As a rule, this substantially direction-independent radiation component has two possible causes: either every individual luminescent material particle sends out light independently of the direction of emission or there arise—if the individual luminescent material particles manifest a directional dependence in emission characteristic—by reason of a random orientation and distribution of the luminescent material particles an overall isotropic superimpositioning of this radiation. The device therefore emits approximately like a diffuse spotlight according to Lambert's law in this wavelength range. Thus, this leads to the colour impression of the light emerging from the device depending on the direction of observation, in particular upon the angle Θ.

Additionally to this, an LED is typically substantially cube-shaped which itself, that is solely due to the geometric conditions, already brings about a non-uniform emission characteristic.

To counteract this effect it is further known additionally to arrange diffusing particles over the LED, which more or less diffusely scatter the radiation sent out by the LED and therefore weaken the angular dependence of the intensity of the radiation sent out by the LED, thus for example the blue light sent out. Altogether, through this there arises a colour impression which less strongly depends on the observation direction or on the angle Θ.

A layer of casting material (also called "forming material" in the following) normally serves for the positional fixing of the fluorescent particles and the diffusing particles, in which material the particles are present spatially distributed. As casting material resin is for example employed, and to be more precise for example in the form of epoxy resin, silicone or polyurethane resin or a rubbery material, for example in the form of silicone. The layer of casting material is often arranged lying directly on the LED.

In FIG. 5 there is illustrated a schematic cross-section through a corresponding device 100 in accordance with the state of the art. The LED 101 is surrounded by a forming material 102, for example epoxy resin, with finely distributed luminescent material particles and diffusing particles therein (not illustrated). The forming material 102 is arranged in a cup-shaped depression of a mounting 103. The LED 2 can be provided as an SMD component or be produced also in "Chip-on-Board" technology. It is schematically indicated by arrows that (with reference to the illustration) downwardly directed radiation is deflected upwardly by reflection and that the radiation sent out by the luminescent material particles (yellow light) is partly refracted to the outside by the forming material and is partly also totally reflected.

In FIG. 2 there is schematically represented, for the example "blue light from the LED" and "yellow light from the luminescent material particles", the different directional dependence of the two mentioned radiation components sent out by a corresponding device in the case without diffusing particles. The indicated numerical values indicate the angle (0° to 360°) between the surface normals of the LED and a certain direction of emission. The intensity is indicated radially (polar diagram).

By the two solid-line curves the emission characteristic is exemplarily given of two different LEDs. The blue light radiated by the LED is preferentially emitted in a spatial angle range around the direction of the surface normals. The radiation thus shows a directional dependence. In accordance with the illustration of FIG. 2 with an increasing angle between the surface normals and the direction of emission the intensity diminishes and reaches its minimum in a direction which lies in the plane of the substrate surface of the LED (90° or 270°). The intensity of the yellow light which is emitted by the luminescent material particles (dotted-line curve) shows practically no directional dependence. Thus this radiation is substantially homogeneous or isotropic.

The blue light is also scattered to a certain extent at the luminescent material particles but as a rule this effect does not suffice to remove the directional dependence of the blue light.

In FIG. 3 there is schematically illustrated the scattering behaviour in a volume with a plurality of diffusing particles. The diffusing particles 110 are embedded distributed in a forming material 112. Apart from the diffusing particles, the forming material 112 contains luminescent material particles (not illustrated).

In FIG. 4 there is schematic represented the arising of a scattered radiation at an individual diffusing particle. In the context of the approximation of geometrical optics the scattering behaviour can be explained by refraction processes of the beams incident on the particle. The beams are thereby refracted on passing through the particle surface due to the different refractive indexes of diffusing particles on the one hand and surroundings on the other hand (diffusing particle: $n_2$, surroundings: $n_1$). (In connection with this, it has to be taken into account that geometrical optics are only suitable for explanation of the scattering for the case that the diffusing particle is substantially larger than the wavelength of the incident radiation. In the case of diffusing particles which are approximately as large as or are smaller than the wavelength, deviations from the geometrical optics depiction must be expected.)

A corresponding light emitting device is known from U.S. Pat. No. 6,653,765 B1. It is pointed out in this document that the diffusing particles should have a refractive index which preferably is larger than 1.2 or particularly preferably larger than 1.46. Furthermore the diffusing particles should absorb as little light as possible. In addition, the scattering behaviour of the diffusing particles is dependent on their size and shape. The diffusing particles should preferably have a size which is within the same order as the wavelength of the radiation to be scattered. With regard to the shape, particles are preferred with irregular surfaces. As material for the diffusing particles there are mentioned glass, quartz, oxides of titanium (Ti), aluminium (Al) and rare earths, such as for example gadolinium (Gd) and yttrium (Y). Titanium oxide (TiO2) and aluminium oxide (AL2O3) are preferred.

Further, it is known from this document to provide a separate layer with luminescent material particles. This layer is substantially planar and has a uniform thickness. Through this the probability that a beam starting out from the LED is incident upon a luminescent material particle increases with increasing angle Θ. The absorption by the layer of the luminescent material particles is thus directionally dependent and consequently also therefore the colour impression upon observing the device.

From U.S. Pat. No. 6,841,933 B2 there is known a corresponding device in which the luminescent material is bound into silicone beads and the silicone beads are arranged distributed in a forming material made of epoxy resin over the LED. The forming material can contain a "diffusing agent" for reinforcement of the diffuse light, whereby as material for this there is mentioned titanium oxide, titanium nitride, tantalum nitride, aluminium oxide, silicon oxide or barium titanate. As a luminescent material numerous organic and also inorganic substances can find employment.

From U.S. Pat. No. 6,069,440 it is known that the forming material of resin contains a dispersion agent which may be barium titanate, titanium oxide, aluminium oxide or silicon oxide. The luminescent material includes at least one element from the group Y, Lu, Sc, La, Gd and Sm and at least one element of the group of Al, Ga, In, and is activated with Cer; for example there may be involved $Y_3Al_5O_{12}$: Ce or $Gd_3In_3$: Ce.

From U.S. Pat. No. 6,936,862 B1 it is known to configure the luminescent material particles and diffusing particles as particles which are made up of luminescent material particles and diffusing particles bound with each other in order to facilitate a distribution as uniform as possible of these particles in the casting mass. The diffusing particles include an oxide, a sulphur component or a selenium component of a metal from the group $(Y, Ce, TB, Gd, SC)_{3+t+u}$ $(Al, Ga, Tl B)_{5+u+2v}$ $(O, S, Se)_{12+2t+3u+3v}$ (Ce, Tb), in which $0<t<5$, $0<u<15$, $0<v<9$.

With the mentioned state of the art there is the problem that there apply for the diffusing particles particularly high requirements with regard to quality class and purity. The production of corresponding diffusing particles particularly is difficult which are suitable with regard to the absorption characteristic, that is manifest as little as possible or "no" absorption of the corresponding radiation sent out by the LED.

BRIEF SUMMARY OF THE INVENTION

The invention concerns indicating a corresponding device which is simpler in production.

In accordance with the invention there is provided a light emitting device which has a radiation emitting element including a semiconductor. The radiation emitting element may be for example an LED which emits for example blue light or light of a certain wavelength range and/or ultraviolet radiation. Furthermore the device has a luminescent material which is able to absorb a part of the radiation sent out by the radiation emitting element, and to send out light with a wavelength which is different from the wavelength of the absorbed radiation. The luminescent material may for example be luminescent material particles which send out for example yellow light. The luminescent material may be present for example in the form of fluorescent particles which are for example embedded into a casting material (English: encapsulation material), for example made of resin. In addition, the device has diffusing particles which are able to scatter a part of the radiation sent out by the radiation emitting element. The diffusing particles are thereby of a non-activated luminescent material.

From the above it is clear that the scattering is important particularly for that radiation component which originates directly from the radiation emitting element, for example originates from the LED, since exactly this component as a rule has a directional dependence which is to be reduced.

Non-activated luminescent material absorbs no or only negligibly little light, particularly in the blue wavelength range. In addition, the non-activated material has the same high stability as corresponding activated luminescent material or even a higher stability than corresponding activated luminescent material. Furthermore the non-activated luminescent material can be produced in practically any desired particle size distribution. In addition, the non-activated luminescent material has a comparatively high refractive index, so that a comparatively large difference between the refractive index of luminescent material on the one hand and the casting material on the other hand can generally be realized. Through these characteristics production of a corresponding device with a certain efficiency is made substantially easier in comparison with the state of the art.

It is possible with the invention, for optimal adjustment of the scattered radiation component, to add in a simple way the diffusing particles of a non-activated luminescent material in the desired size distribution.

The diffusing particles can for example be added distributed in a layer of casting mass of resin or a rubber material, for example silicone, whereby the casting mass has a different refractive index than the diffusing particles (must have for the scattering effect). The casting mass can for example cover the LED directly as a cover layer. The luminescent material may also be present in the form of particles distributed in the casting mass.

Advantageously the material of which the diffusing particles consist is of the same chemical class as the material of which the luminescent material consists.

Preferentially the diffusing particles consist at least in part of non-activated aluminates, for example yttrium aluminium garnet $Y_3Al_5O_{12}$ (YAG), of non-activated earth alkali orthosilicates $Ba_{2-x-y}Sr_xCa_ySiO_4$ of non-activated Thiogallates (Ba, Sr, Ca) $(Ga, Al)_2S_4$, of non-activated earth alkali sulphides (Ba, Sr, Ca)S, of non-activated nitrides $(Ba, Sr, Ca)_2Si_5N_8$, of non-activated oxido—nitrido silicates $(Ba, Sr, Ca)_2Si_{5-a}(Al, Ga, In)aN_{8-a}O_a$, or of other non-activated basic grids (borates, phosphates etc.). It can be provided particularly that the basic grid types of the luminescent material particles are identical to the basic grid types of the diffusing particles.

Advantageously the diffusing particles are at least partially photonic crystals.

Advantageously the distribution of the diffusing particles within the device has a gradient, whereby the distribution density of the diffusing particles decreases with an increasing distance from the LED. Advantageously the distribution of the luminescent material particles has a gradient, whereby the distribution density of the luminescent material particles increases within a region in the device with an increasing distance from the LED. In this way it can be achieved that the radiation sent out by the LED, thus for example blue light sent out, is scattered preferentially first before it is partly changed by the luminescent material particles into radiation of another wavelength. Through this the directional dependence of the radiation sent out by the LED can be reduced particularly effectively.

The can correspondingly also be provided two separate layers whereby in the layer which is located nearer to the LED only diffusing particles are provided and in the layer which is further removed from the LED only luminescent material particles are provided.

Advantageously the diffusing particles have a diameter between about 1 and about 40 μm. The number of diffusing particles can thereby advantageously be selected in dependence upon the (average) diffusing particle size. The smaller the (average) diffusing particle size, the larger can the number of diffusing particles be chosen. This leads advantageously to a correspondingly higher number of scattering events in a given volume and thus to a correspondingly strengthened scattering effect.

Particularly advantageous is a size distribution of the diffusing particles from about 2 to about 30 μm. The distribution may have a maximum, for example approximately at 5 to 6 μm. This is represented schematically in FIG. 6.

Advantageously the diffusing particles have curved surfaces. They can for example be substantially approximately spherical. Curved surfaces can thereby be made up of many small planar surfaces. Less suitable, in contrast, are shapes with plane—parallel surfaces, as is the case for example with plate-like or cube-like particles etc.

Advantageously the number of diffusing particles is the same or less that the number of luminescent material particles. For example in the case of diffusing particles and luminescent particles of barium strontium orthosilicate a ratio of about two parts luminescent material particles to one part diffusing particles can be provided.

Advantageously there can be provided as casting material (or matrix material) silicone, polymethylmethacrylate (PMMA), epoxy resin or polyurethane.

In accordance with another aspect of the invention there is provided a light emitting device which has a radiation emitting element which includes a semiconductor. Further, the device has a luminescent material which is able to absorb a part of the radiation sent out by the radiation emitting element and to send out light with a wavelength which is different from the wavelength of the absorbed radiation. In addition, the device has diffusing particles which are able to scatter a part of the radiation sent out by the radiation emitting element. The diffusing particles consist of the same basic material as the luminescent material, whereby the material of the diffusing particles is non-activated.

In accordance with still another aspect of the invention there is provided a light emitting device which has a radiation emitting element which includes a semiconductor. Further, the device has a luminescent material which is able to absorb a part of the radiation sent out by the radiation emitting element and to send out light with a wavelength which is different from the wavelength of the absorbed radiation. Thereby there is provided for the directions of emission with which the light from the device is emitted a certain (solid angle) range. The luminescent material is thereby arranged such that the absorption path length through the luminescent material is substantially independent of the direction of emission.

Thereby, the radiation emitting element or its centre is to be seen as reference point for the directions of emission. The provided directions of emission may simply lead for example into the half-space which symmetrically extends out around the surface normals of an LED. However, a smaller spatial angular range is also possible for the directions of emission provided.

For example the luminescent material may be present in the form of luminescent material particles which for example are arranged evenly within a layer, whereby the geometric form of the layer is chosen such that the geometric path length through the layer is substantially identical seen in all directions of emission. This can for example be realized by a layer of luminescent material particles arranged above an LED, which layer which has a planar underside and an appropriately convexly formed top side.

Advantageously the luminescent material is arranged within the device in a space between two (imaginary) concentric spherical surfaces. Through this it is made possible in particularly simple way that the absorption by the luminescent material is effected uniformly in all directions of emission. With this there can be achieved overall a particularly homogeneous colour impression, or more generally formulated "visual impression", that is for example a "white impression" of the light emitted by the device. The space between the spherical surfaces of course does not have to be completely filled with the luminescent material. The decisive volume, in which the luminescent material is to be arranged, rather confines itself to that region between the spherical surfaces which includes the desired directions of emission. This space can for example be provided by the half-space which extends from the LED in direction of emission. Thus, in this case the luminescent material can be arranged within two concentric half spherical surfaces.

Advantageously it can be provided that the centre of the spherical surfaces is arranged in the radiation emitting element, thus for example in an LED and further for example in the (geometric) centre of the radiation emitting element. The luminescent material can thereby be arranged for example advantageously between the two concentric spherical surfaces in the half-space which extends in a direction of emission from the radiation emitting element. This can for example be the half-space which extends in the direction of the surface normals of a main emission surface of an LED. Thereby advantageously the luminescent material is present in the form of luminescent material particles which are arranged distributed uniformly in the volume filled with the luminescent material.

The luminescent material can be provided for example in the form of luminescent material particles, which with regard to the radiation emitting element are fixed in location by a casting mass. In addition, the device can have diffusing particles which are able to scatter a part of the radiation sent out by the radiation emitting element. The diffusing particles may be provided in the space between the radiation emitting element and the inner spherical surface. Advantageously if applicable the diffusing particles and also the luminescent material particles are distributed respectively homogeneously.

Further advantageously no luminescent material is provided in the device outside the space between the two spherical surfaces.

In accordance with a still further aspect of the invention there is provided the use of a non-activated luminescent material in a light emitting device, in particular for the scattering of the radiation which is sent out by a radiation emitting element of the device, for example an LED. The luminescent material advantageously is provided in the form of distributed particles which are arranged in a zone in direction of emission.

BRIEF DESCRIPTION OF THE DRAWINGS

Further features, advantages and characteristics are now be explained with reference to a detailed description of exemplary embodiments and with reference to the Figures of the accompanying drawings. There is shown.

DETAILED DESCRIPTION OF THE INVENTION

Figure 1:
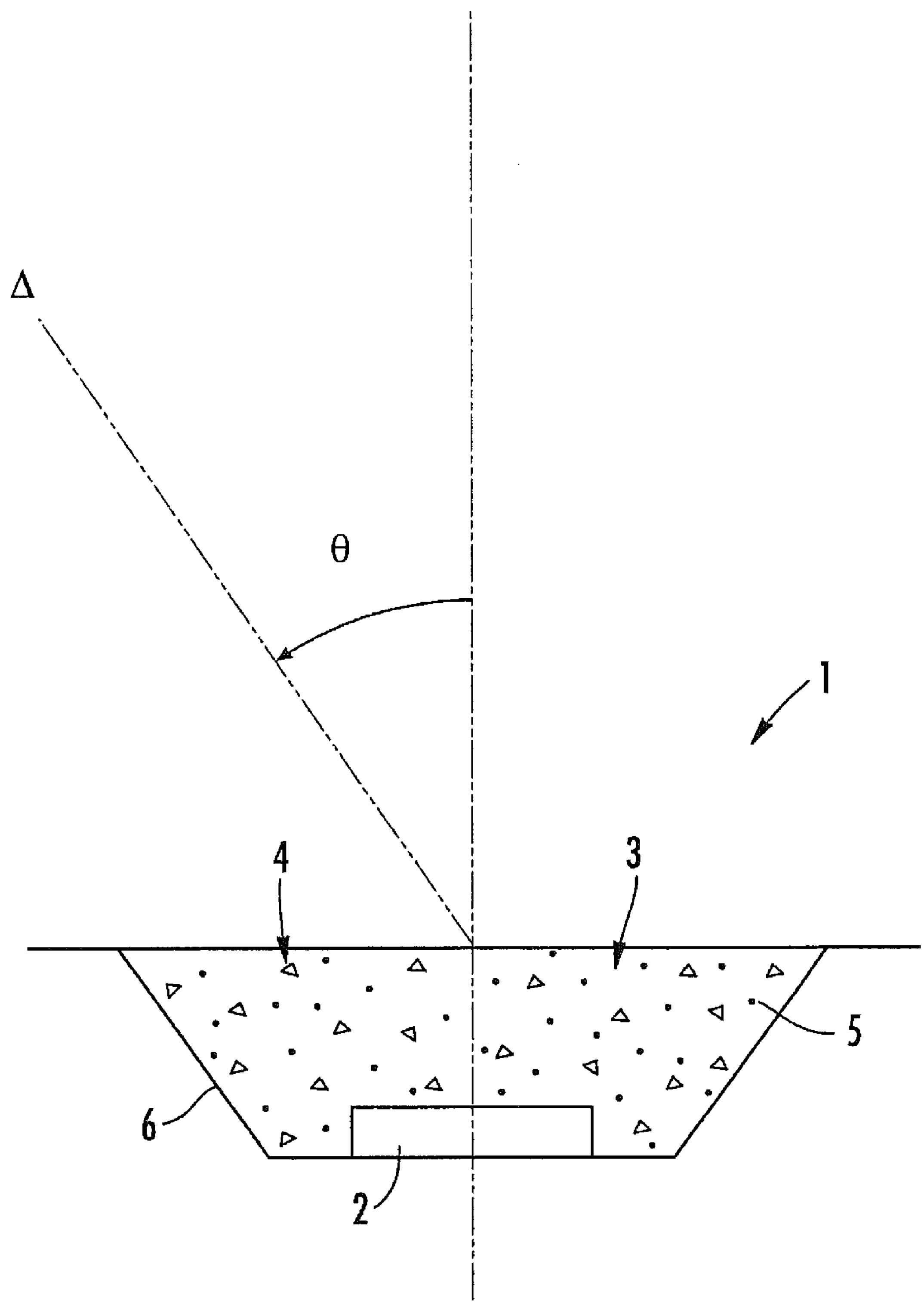
FIG. 1 a schematic cross-section through a light emitting device according to the invention, FIG. 2 typical distribution patterns, on the one hand for radiation sent out by an LED and on the other hand for radiation which is sent out by fluorescent particles, FIG. 3 a basic sketch of the scattering of radiation at diffusing particles in a volume, FIG. 4 a basic sketch of the scattering by light refraction at an individual diffusing particle, FIG. 5 a schematic cross-section through a light emitting device in accordance with the state of the art, FIG. 6 a schematically represented size distribution function of diffusing particles, and FIG. 7 a schematic illustration of another exemplary embodiment of the invention.
Figure 2:
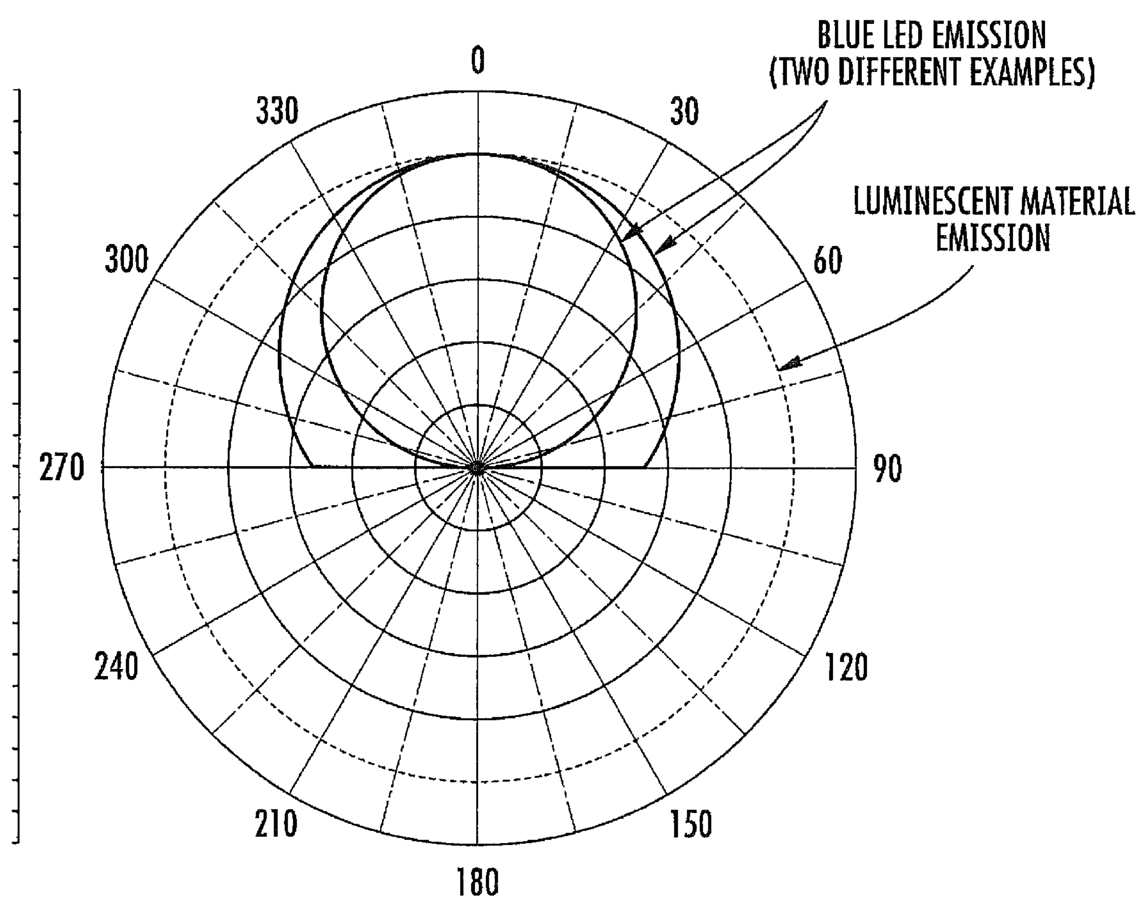
Figure 3:
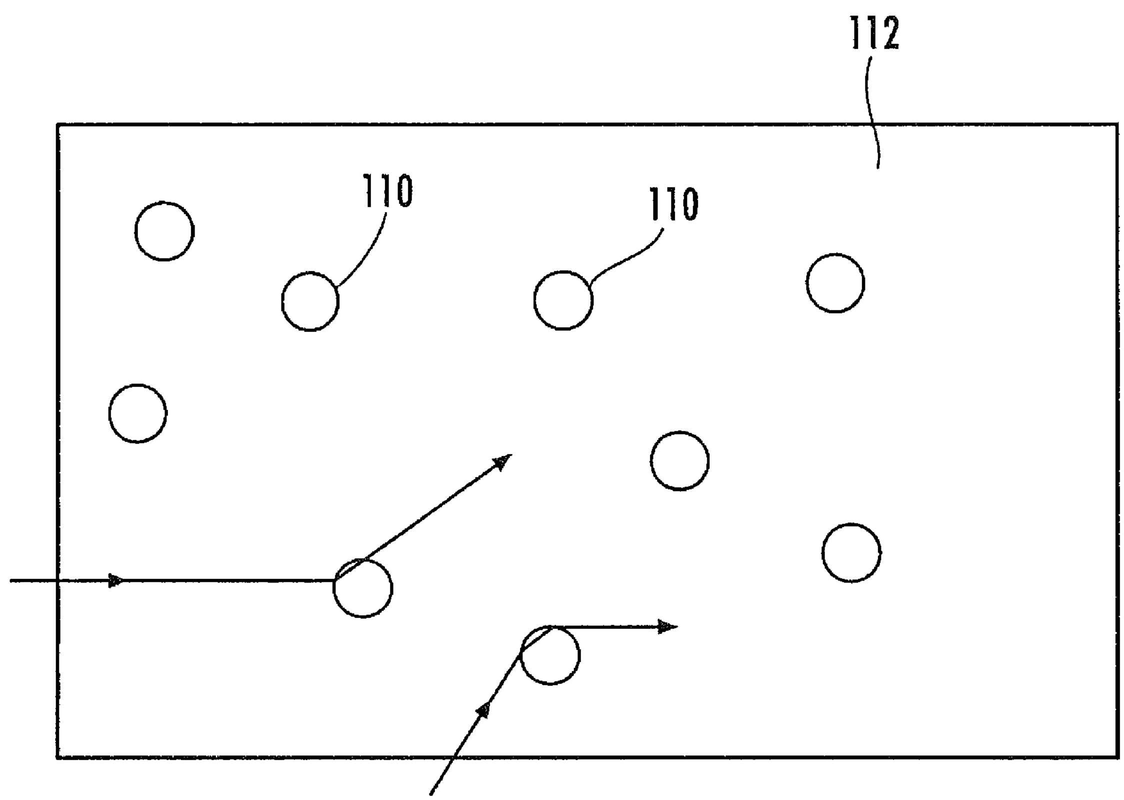
Figure 4:
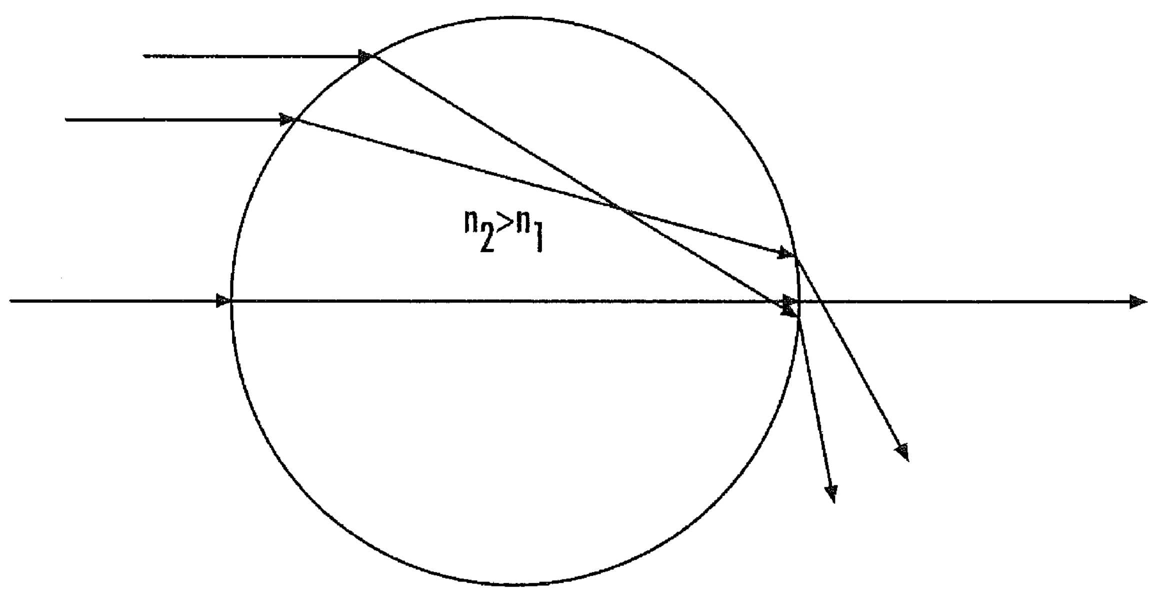
Figure 5:
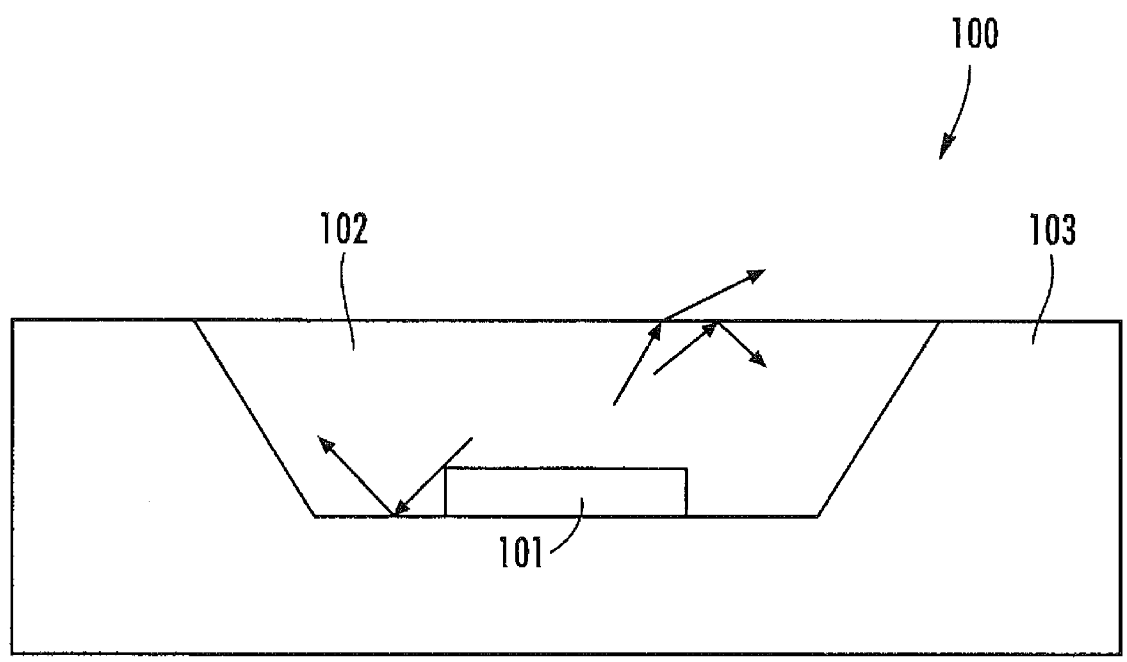

FIG. 1 shows a light emitting device 1. The device has as radiation emitting element, including a semiconductor, a light-emitting diode (LED) 2. The LED 2 radiates for example blue light, upwardly with reference to the illustration. With regard to the electrical components which are necessary for the activation of the LED nothing is said here since they are without immediate relevance for the invention. In this regard attention is directed to the state of the art.

Furthermore the device 1 has a luminescent material in the form of fluorescent particles 3. The fluorescent particles 3, also called luminescent material particles, are able to absorb a part of the radiation which is sent out by the LED 2 and to send out light with a wavelength which is different from the wavelength of the absorbed radiation. The radiation sent out by the luminescent material particles 3 can for example be yellow light. In the case of the radiation which is sent out by the LED 2 and is absorbed by a fluorescent particle 3 there may be involved at least in part also ultraviolet radiation.

Furthermore the present device 1 has diffusing particles 4 which are able to scatter a part of the radiation which is sent out by the LED 2. The diffusing particles 4 are comprised of a non-activated luminescent material.

In accordance with this exemplary embodiment both the fluorescent particles 3 and the diffusing particles 4 are distributed in a forming material 5, a "casting material", which for example may be a resin. Preferred casting material is silicone, PMMA, epoxy resin or polyurethane. The forming material 5 is filled into a cup-shaped depression 6 on the base of which the LED 2 is located in the middle. The diffusing particles 4 consist in accordance with this exemplary embodiment of the same basic material as the fluorescent particles 3, whereby the material of the diffusing particles 4 is, however, non-activated. Through this the diffusing particles 4 have the characteristic that they absorb practically no light and scatter particularly effectively.

In accordance with this exemplary embodiment the diffusing particles 4 are comprised of non-activated barium strontium orthosilicate ($BaSrSiO_4$) or of non-activated YAG. The luminescent material particles 3 are comprised of the same material however with the difference that the material of the luminescent material particles 4 is activated—for example by incorporation of Europium ions.

With use of this material the diffusing particles 4 can be produced in practically any desired size distribution. In order thus to increase the scattering component of the light which leaves the device 1 upwardly, with reference to FIG. 1, the distribution density of the diffusing particles 4 in the forming material 5 can for example simply be increased correspondingly (and correspondingly the other way round).

Figure 6:
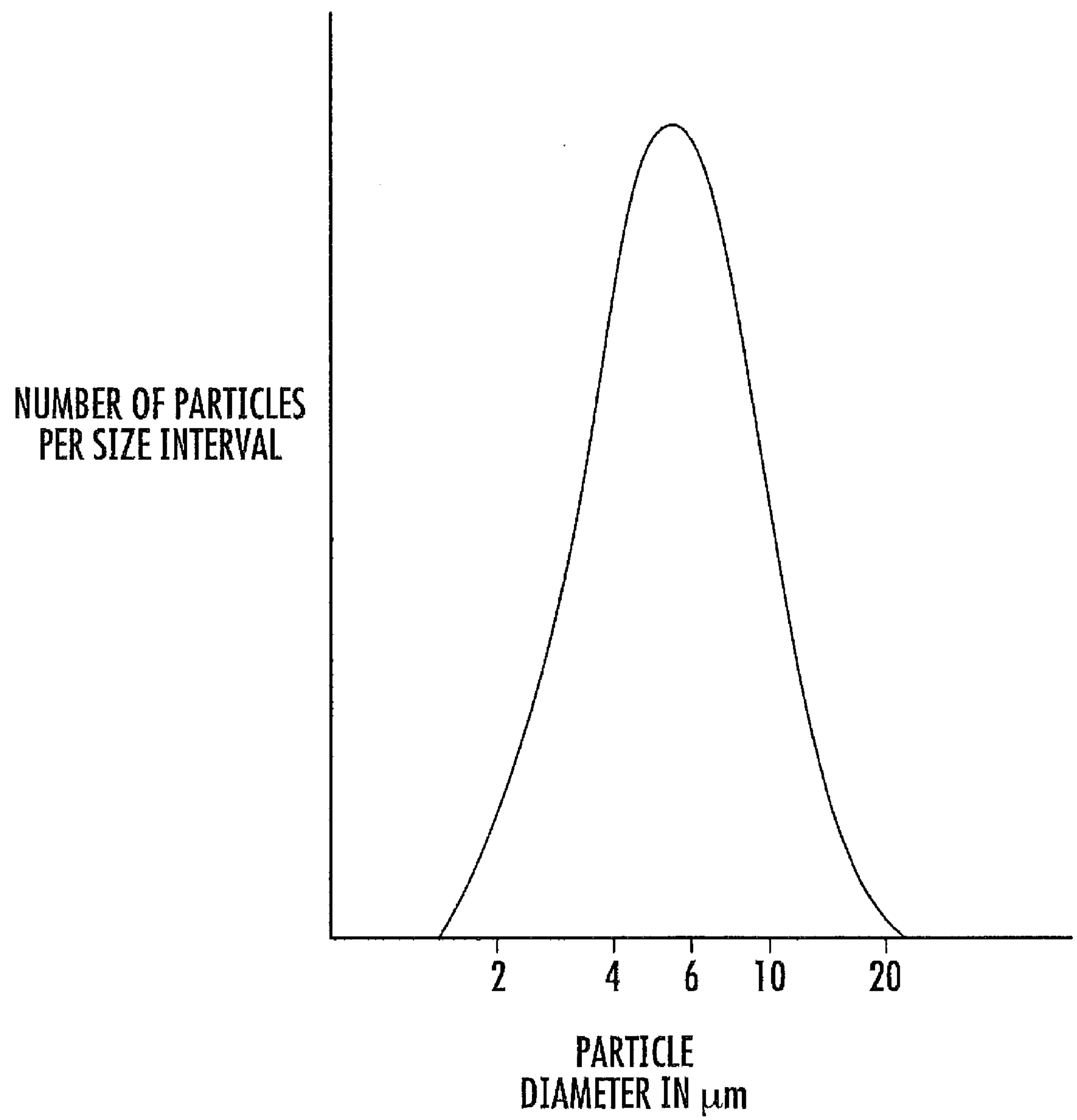

The diffusing particles 4 are substantially spherical. Their diameter lies in the range of approx. 2 to 30 μm. The size distribution of the diffusing particles thereby has a maximum and to be more precise at about 5 to 6 μm. Such size distribution is schematically illustrated in FIG. 6.

The distribution of the diffusing particles 4 in the forming material 5 can be provided to be uniform (considered spatially). It can, however, also advantageously be provided that the diffusing particles 4 in the immediate vicinity of the LED 2 are provided more densely than in a higher area of the forming material 5; that is in an area which is further removed from the surface of the LED. It can thus for example be provided that the diffusing particles 4 are provided in an immediate vicinity of the LED 2 whilst the fluorescent particles 3 are provided in the other region of the forming material 5, thus for example in the upper half (with reference to FIG. 1) of the forming material 5. In this case the light which is sent out by the LED 2 is at first predominantly distributed more or less diffusely by the diffusing particles 4 in all directions before it meets the region with the fluorescent particles 3. The forwards peak of the (blue) radiation of the LED 2 can through this be particularly effectively reduced and an overall more uniform angular distribution of the emission of the device 1 attained.

Figure 7:
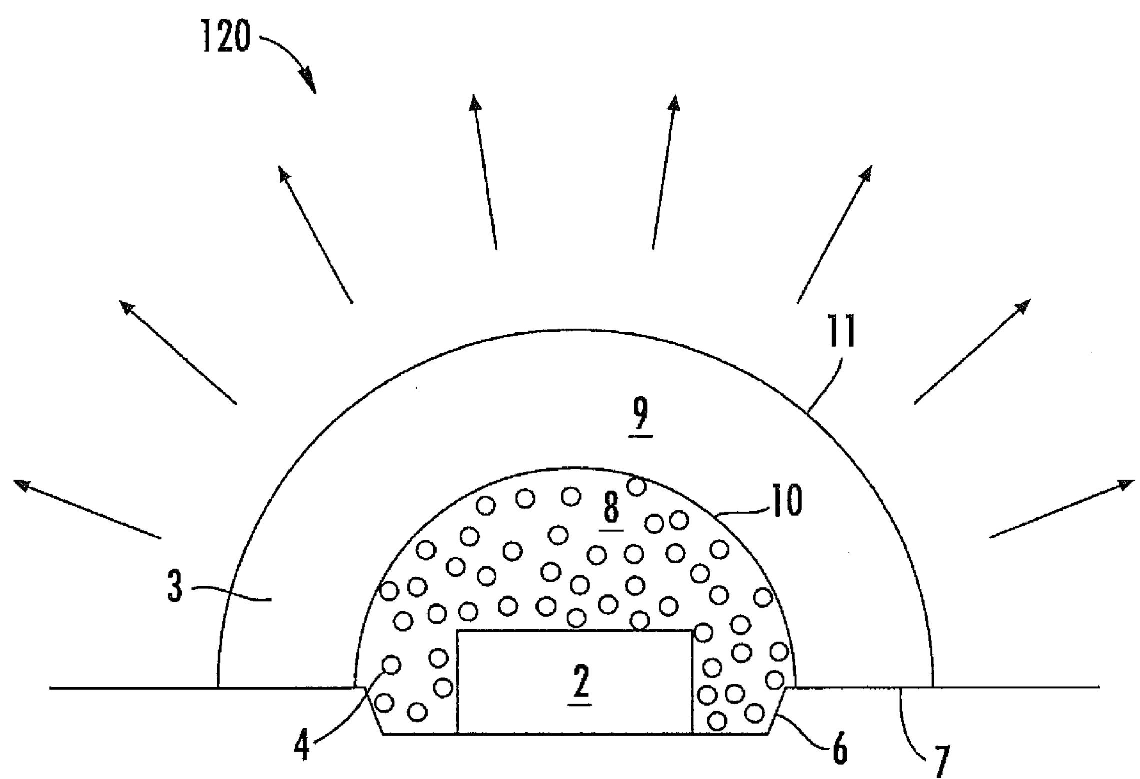

In FIG. 7 there is illustrated a device 120 in accordance with a second exemplary embodiment. In this case a spatial separation is provided between diffusing particles 4 and luminescent material particles 3 (not shown in detail). The LED 2 is covered by a first layer 8 which is formed from a casting mass, in which the diffusing particles 4 are arranged distributed spatially uniformly. The diffusing particles 4 can in accordance with this exemplary embodiment for example consist of silica gel (silicic acid gel). Thus the first layer 8 represents a scattering layer.

The first layer 8 lies directly on the LED 2. Its surface 10 which faces upwardly (with reference to the illustration) is dome shaped. This bounding surface 10 has the form of a part of spherical surface, to be more precise approximately a half spherical surface.

On the first layer 8 there immediately borders a second layer 9 in which the luminescent material particles 3 are arranged uniformly in a casting mass. The second layer 9 may be comprised of a polymer which has a refractive index which is similar to that of the first layer 8.

The luminescent material particles 3 of the second layer 9 so to speak change—at least partially—the wavelength of the radiation sent out by the LED 2 and incident on the second layer 9. For example yellow light arises from blue light which is radiated by the LED 2, by fluorescence at the luminescent material particles 3. So one can speak about a (wavelength) transformation layer 9.

The upwardly outwardly directed surface 11 of the second layer 9 is in turn dome-like. Thus this surface 11 is in turn spherical section like and thereby concentric with the bounding surface 10 between the two layers 8 and 9.

The LED 2 is arranged in a cup-shaped depression 6 which is formed in a plane surface 7. In accordance with this exemplary embodiment the depression 6 is approximately half as deep as the vertical extent (height) of the LED 2 (with reference to the illustration), so that the geometric middle point of the LED 2 lies approximately in the plane which is given by the surrounding surface 7.

The surface 10 of the first layer 8 borders approximately on the edge of the depression 6 on the surrounding plane surface 7. Thus the diameter of the depression 6 is approximately the same as the diameter of the first layer 8.

Thus the two surfaces 10 and 11 are arranged concentrically and it can be provided that the middle point of these two sphere part surfaces 10, 11 lies in the centre of the LED 2.

The radiation sent out by the LED 2 is partly scattered in the first layer 8 at the diffusing particles 4. Through this the directional dependence of the intensity of this radiation component is noticeably weakened and there arises a radiation which is substantially "more homogeneous" or "more isotropic" with reference to the direction of propagation of this radiation.

It also can be provided that the depression 6 is completely or partly reflecting for radiation sent out by the LED 2. In this case it generally comes also to reflection in the bottom or edge region of the depression 6.

Overall, it is brought about through this that the radiation which is incident on the boundary surface 10, coming from the layer 8, in substance does not have any preferred direction or at least is substantially less direction-dependent than would be the case without diffusing particles. Since the second layer 9 has a uniform radial layer thickness and the luminescent material particles 3 are distributed uniformly in this layer 9, the absorption which takes place in the transformation layer 9 is also independent of the location at which the radiation coming from the first layer 8 enters the second layer 9 (except for possible edge effects in the vicinity of the plane surrounding surface 7). Thus the absorption path length is substantially independent of the entry point of the radiation. In this way it is thus avoided that through the provision of a luminescent material layer a directional dependence is provided for the light which is sent by the device 120 to the outside.

Overall, it is achieved with this arrangement that the radiation which starts out from the device 120, substantially at all locations of the outer spherical surface 11, which can represent a surface of the device 120, is predominantly vertically outwardly directed. This is outlined into FIG. 7 by arrows. In this way the "homogeneity" of the radiation characteristic of the device 120 can be increased. The far-field region (e.g. on a screen) also can through this be configured particularly homogeneously.

For production, diffusing particles can be mixed of non-activated material and luminescent material particles of activated material in the desired ratio, thus for example 1:2 and added to the casting material. This mixture can then be cast or otherwise applied for example directly onto the LED.

The advantages of the invention can thus be summarized as follows:

- the device is comparatively simple and economical in production.
- with the device there can be brought about a more uniform, for example more white light impression, which is relatively uniform over all possible viewing directions.
- the diffusing particles can be produced with any desired size distribution so that a fine adjustment of the component of scattered light can be attained.

The invention claimed is:

1. Light emitting device, having a radiation emitting element, including a semiconductor, luminescent material which is able to absorb a part of radiation sent out by the radiation emitting element and to send out light with a wavelength which is different from a wavelength of the absorbed radiation, and diffusing particles which are able to scatter a part of the radiation sent out by the radiation emitting element, wherein the diffusing particles are comprised at least in part of non-activated $BaSrSiO_4$.

2. Light emitting device according to claim 1, wherein, a material of which the diffusing particles are comprised is of a same chemical class as a material of which the luminescent material is comprised.

3. Light emitting device according to claim 1, wherein, the diffusing particles are at least in part photonic crystals.

4. Light emitting device according to claim 1, wherein, a distribution of the diffusing particles within the device has a gradient, whereby a distribution density of the diffusing particles decreases with increasing distance from the LED.

5. Light emitting device according to claim 1, wherein, the luminescent material is present in a form of particles and within a region of the device a distribution of the luminescent material particles has a gradient, whereby the distribution density of the luminescent material particles increases with increasing distance from the LED.

6. Light emitting device according to claim 1, wherein, the diffusing particles that have diameters between about 1 and about 40 gm.

7. Light emitting device according to claim 1, wherein, the diffusing particles are substantially spherical.

8. Light emitting device according to claim 1, wherein, the luminescent material is present in a form of particles and a number of diffusing particles is smaller or equal to a number of particles of the luminescent material.

9. Light emitting device according to claim 1, wherein, the diffusing particles and/or the luminescent material are embedded in a casting material.

10. Light emitting device according to claim 9, wherein, the casting material is silicone, PMMA, epoxy resin or polyurethane.

11. Light emitting device of claim 1, wherein the non-activated luminescent material together with an activated luminescent material in the device is configured to improve colour uniformness of an angular distribution of the emission of the device.

12. Light emitting device, comprising a radiation emitting element, including a semiconductor, luminescent material which is able to absorb a part of radiation sent out by the radiation emitting element and to send out light with a wavelength which is different from a wavelength of the absorbed radiation, and diffusing particles which are able to scatter a part of the radiation sent out by the radiation emitting element and/or to scatter a part of the light sent out by the luminescent material, wherein, the diffusing particles are of the same basic material as the luminescent material, wherein the material of the diffusing particles is non-activated.

* * * * *